United States Patent [19]

Burley

[11] Patent Number: 5,010,316

[45] Date of Patent: Apr. 23, 1991

[54] THERMOCOUPLES OF ENHANCED STABILITY

[75] Inventor: Noel A. Burley, Melbourne, Australia

[73] Assignee: Bell-TRH Limited, New South Wales, Australia

[21] Appl. No.: 159,923

[22] Filed: Feb. 24, 1988

[30] Foreign Application Priority Data

Oct. 23, 1987 [AU] Australia .............................. PI5032

[51] Int. Cl.$^5$ ............................................. H01C 1/03
[52] U.S. Cl. .................................. 338/238; 338/239; 219/544; 174/102 A
[58] Field of Search ............... 338/238, 239, 240, 241, 338/242, 26; 219/544, 548, 546; 174/102 A, 102 P, 118; 136/230, 233, 234; 420/442, 443

[56] References Cited

U.S. PATENT DOCUMENTS

| | | | |
|---|---|---|---|
| 3,828,296 | 8/1974 | Eiselstein et al. ............... | 338/238 X |
| 3,972,740 | 8/1976 | Starr ................................. | 136/239 |
| 4,288,247 | 9/1981 | Shaw ................................. | 420/443 |
| 4,474,733 | 10/1984 | Susukida et al. .................. | 420/443 |
| 4,491,822 | 1/1985 | Davis ................................ | 338/238 X |
| 4,498,071 | 2/1985 | Plough, Jr. et al. ............. | 219/548 X |
| 4,692,305 | 9/1987 | Rangaswamy et al. ......... | 420/443 X |
| 4,719,080 | 1/1988 | Duhl et al. ....................... | 420/443 X |
| 4,742,324 | 5/1988 | Shida et al. ...................... | 338/238 |
| 4,743,514 | 5/1988 | Strangman et al. ............. | 420/443 X |
| 4,749,546 | 6/1988 | Burley ............................. | 420/443 X |
| 4,834,807 | 5/1989 | Burley ............................. | 136/230 X |

FOREIGN PATENT DOCUMENTS

| | | |
|---|---|---|
| 40913 | 4/1985 | Australia . |
| 1133443 | 7/1962 | Fed. Rep. of Germany . |
| 733535 | 7/1955 | United Kingdom . |
| 746274 | 3/1956 | United Kingdom . |

OTHER PUBLICATIONS

PCT application PCT/AU8700306 (WO 88/02106) International Publication date of Mar. 24, 1988, "Stable Metal-sheathed Thermocouple Cable".

Journal of Physics E. Scientific Instruments, vol. 19, No. 4, Apr. 1986, pp. 262-268, Bristol, GB; R. E. Bentley et al.: "Ni-based Thermocouples in the Mineral-In-sulated Metal-Sheathed Format": Thermoelectric Instabilities to 1100° C.

Primary Examiner—Bruce A. Reynolds
Assistant Examiner—Marvin M. Lateef
Attorney, Agent, or Firm—Armstrong, Nikaido, Marmelstein, Kubovcik & Murray

[57] ABSTRACT

There is described mineral-insulated metal-sheathed (MINS) cables in which the sheath alloy has the following compositions:

| Element | Concentration (wt. %) |
|---|---|
| Cr | 10 to 40 |
| Si | 0.5 to 5.0 |
| Mg | 0.5 Maximum |
| Ce | 0.3 Maximum |
| Mo | 20 Maximum |
| W | 25 Maximum |
| Nb | 10 Maximum |
| Ta | 8.0 Maximum |
| Ni | balance | and thermocouples, heating elements, and heat detectors made therefrom as well as the alloy itself is also claimed.

10 Claims, 1 Drawing Sheet

THERMOCOUPLES OF ENHANCED STABILITY

BACKGROUND OF THE INVENTION

1. Field of the Invention

This invention relates to mineral-insulated metal-sheathed electrically conductive cables of a novel integral design.

2. Description of Related Art

The cables of the invention are suitable for use as thermocouple cables, heat detectors and heating elements that are particularly useful at high temperatures.

The invention utilises nickel-base alloys as sheath materials and thermoelement conductors which have been specifically developed for the purpose.

In one aspect the invention provides nickel-base thermocouple cables having enhanced thermomechanical properties, superior oxidation resistance, greater longevity and greater thermoelectric stability under longer time periods and over a range of higher temperatures up to 1300° C., than existing base-metal cables and sensor systems of the same general kind.

The invention also provides electrically conductive cables including such cables suitable for use as heat detectors and heating elements.

Nickel-base alloys have been used as thermocouples since the early part of this century. An earlier and now universal nickel-base thermocouple is designated TYPE K by the Instrument Society of America (ISA). A more recent and more stable nickel-base thermocouple is designated TYPE N by the ISA. Typical nominal compositions of the thermoelement alloys which comprise these thermocouple systems are as follows:

| ALLOY (ISA symbol) | COMPOSITION (wt. %) | | | | | |
|---|---|---|---|---|---|---|
| | Cr | Mn | Al | Si | Co | Mg |
| KP | 9.3 | | | 0.4 | 0.2 | |
| NP | 14.2 | | | 1.4 | | |
| KN | | 2.8 | 2.0 | 1.0 | 0.4 | |
| NN | | | | 4.4 | | 0.2 |

The type K thermocouple is recommended to be used in an air atmosphere. At the higher temperatures (above about 1000° C.) this thermocouple fails because of its relatively poor oxidation resistance and hence poor thermoelectric stability. In contrast the type N thermocouple has greatly enhanced oxidation resistance and hence greatly enhanced thermoelectric stability up to about 1300° C.

One way in which attempts have been made to overcome the unstable performance of type K thermocouples at the highest temperatures is to incorporate them in the so-called MIMS (mineral-insulated metal-sheathed) format of a compacted ceramic-insulated thermocouple sensor assembly.

As is well known in the art, a first step in the manufacture of such thermocouple sensors is to produce the so-called MIMS cable which comprises a sheath containing one or more thermoelement conductor wires electrically insulated from the sheath (and from each other when two or more conductor wires are used) by compacted mineral insulation material.

Figure 1:
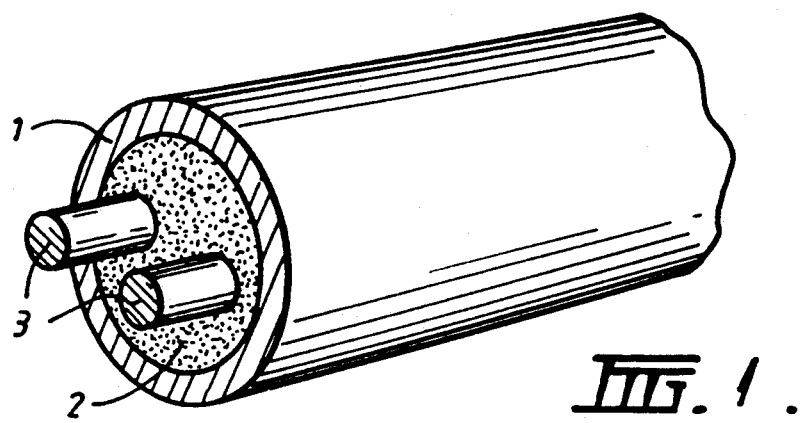
FIG. 1 illustrates a typical MIMS cable containing two conductor wires.

To make an actual sensor from a cable of the type illustrated in FIG. 1, the cable is cut and the ends of the conductors are exposed by removing some of the insulation therefrom. The exposed ends of the conductors are then joined to form a thermojunction, which may be accomplished for example by crimping and/or welding.

The thermojunction may simply be left exposed for use in appropriate environments or may be protected by capping the sheath over the thermojunction with or without insulant.

The latter type of thermocouple sensor has come into common use because it isolates the thermocouple wires from environments that may cause rapid deterioration and it provides excellent high-temperature insulation for the thermocouple conductor wires. The sheath is normally made of a material which is chosen on the basis of its compatibility with the environments and processes in which it is being used. The conventional sheath materials which are in universal use are stainless steel and Inconel (a tradename of the INCO Group of companies).

The MIMS type of construction bestows on thermocouples certain other general advantages the main of which are:
(i) physical isolation of thermocouple wires from chemical environments that may cause rapid deterioration;
(ii) electrical isolation of thermoelement conductors from external sources of interference that may cause spurious signals;
(iii) mechanical protection of thermocouples from damage due to pressure or shock;
(iv) mechanical flexibility of assembly, allowing bending in installation; and
(v) simple fabrication of thermocouples.

Because of these apparent advantages, MIMS type thermocouple sensors have more recently been fabricated to incorporate the type N thermocouple to take added advantage of the higher thermoelectric stability of the latter.

There are numerous commercial suppliers of compacted ceramic-insulated integrally-sheathed thermocouples incorporating either stainless steel or Inconel sheaths and either type K or type N thermoelement conductor wires.

At temperatures above about 1000° C. the types of compacted ceramic-insulated integrally-sheathed MIMS cables and thermocouples described above fail prematurely because of factors such as
(i) the materials of which their sheaths are made, such as Inconel and stainless steel, fail by deterioration due to oxidation or other accelerated interaction with their gaseous environment;
(ii) the individual alloys of the type K thermocouple fail as a result of accelerated oxidation by low-pressure air residual in the compacted ceramic insulation;
(iii) the thermoelement conductor wires fail mechanically because of the substantial alternating strains imposed during thermal cycling. These strains are caused primarily by longitudinal stresses which arise because of substantially different temperature coefficients of linear expansion of the sheath and thermoelement materials. Some typical average values of these coefficients of expansion are:

| Component | Material | x10$^{-6}$ °C.$^{-1}$ (1000° C.) |
|---|---|---|
| sheath | stainless steel | 21 |
| thermoalloys | type K | 17 |
| | type N | 17.5 |

(iv) the thermoelement conductor alloys are contaminated by dissolution of extraneous elements received from a different sheath alloy by thermal diffusion through the compacted insulating material (these elements, in particular manganese which diffuses in the vapour phase, can cause substantial changes in the thermoelectromotive force of the thermoelement alloys of the thermocouple);

(v) in the case of the type N thermocouple alloys, although they are highly resistant to oxidation in the low-pressure air residual in the compacted ceramic insulation they nevertheless show a relatively small drift in thermal emf in the first 100-or-so hours of exposure (this is thought to be due to one or more of several factors such as sluggish passivation of thermoalloys by oxide formation in low-pressure residual oxygen characteristic of the interstices of MIMS cable compacts, temporal fixation of residual impurity components such as carbon by reaction with emf-sensitive components of thermoalloys such as chromium, or other phenomena affecting magnitudes of thermoelectromotive force);

(vi) the thermomechanical properties such as stress-rupture and tensile strength of sheath alloys such as Inconel and stainless steel may be inadequate to withstand high operating stresses experienced in certain difficult applications (such as the measurement of temperature in gas-turbine jet-engines);

(vii) the composition of type K thermoelement conductor wires may be altered by exposure of the thermocouple to prolonged nuclear irradiation, which results in the transmutation of one or more elements in the alloy.

All these causes of failure exist because, in the past, insufficient consideration has been given to the optimum design of MIMS thermocouples as an *integrated system*. The choice of sheath materials and the choice of thermocouple type has been made independently. The sheath material has been chosen to match the environment and the thermoelements to match existing pyrometric instrumentation or even because of greater familiarity.

As a result, there is a pressing need for a new integral compacted ceramic-insulated cable suitable for use in the fabrication of thermocouples (or of heating elements or heat sensors) which is substantially free of the degradative influences described above and which consequently demonstrates greatly enhanced environmental and thermoelectric stabilities at temperatures up to 1300° C.

It is believed therefore that a new compacted ceramic-insulated integrally-sheathed cable of a novel integrated design, substantially free of degradative influences such as accelerated oxidation, differential thermal stresses, cross-contamination by diffusion, transmutations, and inadequate thermomechanical properties, and consequently demonstrating enhanced resistance to environmental interactions, to drift in thermoelectromotive force and in resistivity, and freedom from mechanical failure at the highest temperatures, in a variety of atmospheres, is a significant advancement in the art.

OBJECTS OF THE INVENTION

It is one of the objects of this invention to provide metal-sheathed mineral-insulated (MIMS) thermocouple cables and sensors of a novel integrated design which show ultra-high thermoelectric stability up to 1300° C. It is a further object of this invention to provide MIMS thermocouple cables and sensors which are highly oxidation resistant up to 1300° C. It is again a further object of this invention to provide novel sheath alloys for MIMS thermocouple cables and sensors which have thermomechanical properties which are significantly enhanced over those shown by conventional sheath materials stainless steel and Inconel. It is yet a further object of this invention to provide MIMS thermocouple cables and sensors, which are free from thermoelectric instabilities due to the compositional changes induced by transmutational effects of nuclear radiation.

It is another object of the invention to provide electrically conductive MIMS cables and heating elements which have similar advantages at high temperatures.

It is yet another object of the invention to provide electrically conductive MIMS cables and heat detectors which have similar advantages at high temperatures.

SUMMARY OF THE INVENTION

The objects of this invention are achieved, in one aspect of the invention, by the use of a novel special alloy, and certain novel compositional variants of this alloy, as a sheath alloy in conjunction with the thermoelement alloys mentioned above in the new MIMS cable configuration. These alloys are designed to be more oxidation resistant, stronger, more ductile, and capable of continuous operation at much higher operating temperatures, than the conventional sheath materials stainless steel and Inconel. The chemical composition tolerances (percentages by weight) for the alloying components of the preferred said special alloy are

| Element | Concentration |
|---|---|
| Cr | 14.0 ± 0.5 |
| Nb | 3.5 ± 1.5 |
| Si | 1.4 ± 0.1 |
| Mg | 0.15 ± 0.05 |
| Ce | 0.05 ± 0.05 |
| Ni | balance |

DETAILED DESCRIPTION OF THE INVENTION

The said special alloy is designed to have a single solid-solution base of Ni-Cr-Si which is strong and oxidation resistant. The oxidation resistance is enhanced by the addition of certain critical trace-quantities of Mg and Ce and of the bulk quantity of Nb to this solid solution structure.

Figure 2:
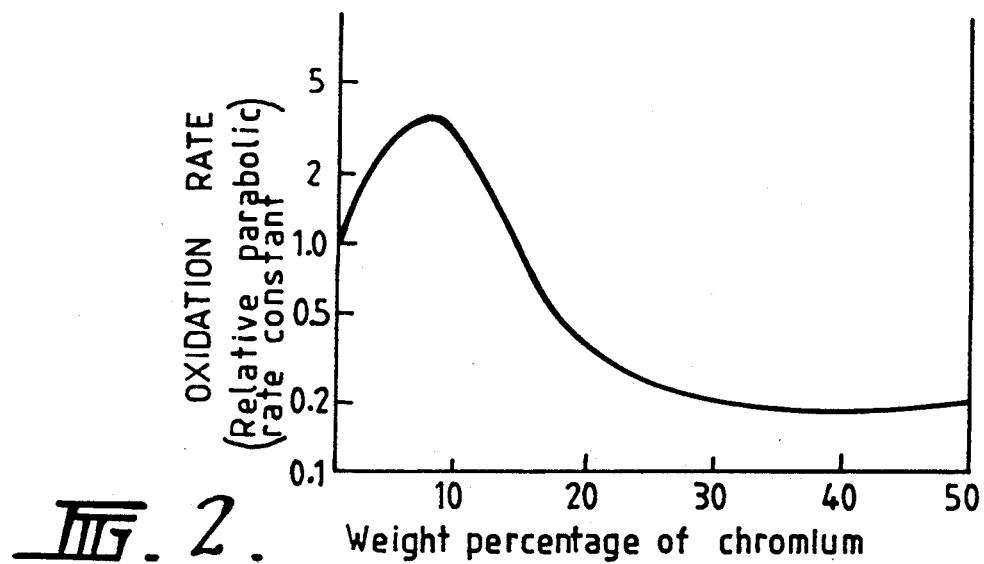
FIG. 2 illustrates the relative oxidation resistance of nickel-chromium binary alloys as will be referred to in more detail below.

Furthermore, experimental measurements have shown that the oxidation resistance of the Ni-Cr-Si base is improved by increasing the chromium content, over a wide range, above the critical internal-to-external oxidation transition composition which is about 12 weight percent. This is illustrated in FIG. 2. In relation to FIG. 2, below about this concentration (12 wt-%) the deleterious effect of internal oxidation on quantitative oxidation rates is clearly shown. Thus the chromium content of the Ni-Cr-Si base can be broadened to cover the range 10 to 40 weight percent. Similar considerations apply to the silicon content of the Ni-Cr-Si base, so that it can be broadened to cover the range 0.5 to 5.0 weight percent silicon.

Nb has a marked effect in increasing the high-temperature strength and ductility of the Ni-Cr-Si single solid-solution base. The desired effect of strengthening at high temperatures can in fact, be achieved by a number of optional strengthening elements whose effect on the single solid-solution structure is similar to that of Nb. The solid-solution strengthening effects of niobium and of these optional elements tungsten, tantalum and molybdenum, although characterized by individual concentration-dependent maxima, are efficaceous over the whole range of their respective terminal solid solubilities in the Ni-Cr-Si alloy base. Thus their concentrations in the Ni-Cr-Si base can be broadened to cover these respective terminal solid solubility ranges. The preferred embodiments of a range of possible optional alloys is set down in Table 1.

TABLE 1

| Component Element | Alloy Option (composition - percent by weight) | | | | | |
|---|---|---|---|---|---|---|
| | 1 | 2 | 3 | 4 | 5 | 6 |
| Cr | ← 10 to 40 → | | | | | |
| Si | ← 0.5 to 5.0 → | | | | | |
| Mg | ← 0.5 maximum → | | | | | |
| Ce | ← 0.3 maximum → | | | | | |
| Mo | 1.0 to 20 | — | — | — | 1.0 | 3.0 |
| W | — | 0.5 to 25 | — | — | 0.5 | 1.0 |
| Nb | — | — | 1.0 to 10 | — | 1.0 | — |
| Ta | — | — | — | 0.5 to 8.0 | 1.0 | — |
| Ni | ← Balance → | | | | | |

The compositions of the sheath alloys in the present invention require the careful selection of component elements of very high purity and the achievement of correct proportions of each by adequate control of melting and casting techniques. In all cases the effects of one component element depend on those of the others and hence there is an interdependence of the elements within the overall composition. Thus the strengthening elements Mo, W, Nb, and Ta, when added to the preferred base alloy of the Ni-Cr-Si, in any combination, have effects one with another as stated above.

Alloys of this invention may therefore be compositionally variant in respect of the Mo, W, Nb and Ta contents to a greater degree than is indicated by the preferred embodiments described in Table 1. A second group of preferred embodiments of the alloys of this invention is therefore described as follows

| Element | Concentration (wt. %) |
|---|---|
| Cr | 10 to 40 |
| Si | 0.5 to 5.0 |
| Mg | 0.5 Maximum |
| Ce | 0.3 Maximum |
| Mo | 20 Maximum |
| W | 25 Maximum |
| Nb | 10 Maximum |
| Ta | 8.0 Maximum |
| Ni | remainder, apart from impurities. |

The invention also includes the above as novel alloys, i.e. nickel-based alloys containing by weight 10 to 40 percent chromium and 0.5 to 5.0 percent silicon, characterized by containing at least one of molybdenum, tangsten, niobium and tantalum in the proportions specified above.

Vacuum-melted ingots of certain test alloys, whose specific compositions were chosen from within the ranges of compositions specified in Table 1, were extruded into desired shapes from which special test-pieces were machined. Tests to determine tensile strength and ductility at various temperatures were carried out using a standard test-piece 80 mm long×12.7 mm diameter, with a narrowed portion 32 mm long. The gauge length=5.65/A, where A=cross-sectional area of the test-piece. A KN Zwick universal testing machine, especially modified to facilitate the high-temperature tests, was used. Each test involved straining the test piece at a rate of 0.002 mm/mm/min up to the 0.5% proof stress and then at 3.2 mm/min until fracture. Ductility was assessed by measuring the elongation of the test-piece between gauge marks and the reduction of cross-sectional area of the fracture face.

The superior properties of these specific examples of alloys according to the invention are shown in the following Tables 2 and 3.

Table 4 summarizes the results of another experiment in which the base alloy was Ni-Cr-Si. The alloys of the present invention were compared with Inconel-600 and stainless steel-310. It is clear that the new MIMS sheath alloys of this invention have quite superior thermomechanical properties to the conventional sheath alloys stainless steel and Inconel.

TABLE 2

| Nickel-Base Alloy (wt. %) | TENSILE STRENGTHS AT ELEVATED TEMPERATURES | | | | | | | | | | |
|---|---|---|---|---|---|---|---|---|---|---|---|
| | Temperature (°C.) | | | | | | | | | | |
| | Room | | 400 | | 600 | | 800 | | 1000 | | 1200 |
| | 1 | 2 | 1 | 2 | 1 | 2 | 1 | 2 | 1 | 2 | 1 | 2 |
| (Base) 14.3Cr—1.4Si—0.1Mg | 498 | 211 | 550 | 143 | 423 | 136 | 178 | 86 | 67 | 25 | 27 |
| Base + 0.5 W | 621 | 229 | 576 | 155 | 483 | 140 | 217 | 109 | 72 | | 27 |
| Base + 3.0 Mo | 648 | 262 | 599 | 180 | 523 | 164 | 263 | 146 | 86 | | 32 |
| Base + 3.0 Nb | 635 | 288 | 646 | 201 | 561 | 196 | 311 | 189 | 106 | | 31 |
| Base + 1.0 Ta | 635 | 248 | 571 | 158 | 491 | 140 | 222 | 120 | 70 | | 28 |
| Base + 1.0Mo—1.0Nb+0.5W—1.0Ta | 651 | 258 | 585 | 170 | 513 | 145 | 278 | 155 | 84 | | 32 |
| Base + 0.04 Ce | 618 | 229 | 553 | 143 | 465 | 135 | 200 | 102 | | | |

Notes:
Columns 1 give Ultimate Tensile Strengths in megapascal (N.mm$^{-2}$)
Columns 2 give 0.2% Proof Stresses in megapascal (N.mm$^{-2}$)

TABLE 3

DUCTILITIES AT ELEVATED TEMPERATURES

| Nickel-Base Alloy (wt. %) | Room | | 400 | | 600 | | 800 | | 1000 | | 1200 | |
|---|---|---|---|---|---|---|---|---|---|---|---|---|
| | 1 | 2 | 1 | 2 | 1 | 2 | 1 | 2 | 1 | 2 | 1 | 2 |
| (Base) 14.3Cr—1.4Si—0.1Mg | 28 | 33 | 51 | 68 | 38 | 45 | 52 | 37 | 97 | 73 | 126 | 90 |
| Base + 0.5 W | 49 | 73 | 53 | 77 | 41 | 47 | 80 | 63 | 117 | 71 | 125 | 100 |
| Base + 3.0 Mo | 55 | 72 | 56 | 73 | 57 | 62 | 104 | 73 | 74 | 51 | 112 | 81 |
| Base + 3.0 Nb | 53 | 61 | 58 | 67 | 60 | 66 | 91 | 71 | 108 | 70 | 135 | 98 |
| Base + 1.0 Ta | 51 | 74 | 56 | 70 | 52 | 68 | 39 | 33 | 110 | 65 | 112 | 100 |
| Base + 1.0Mo—1.0Nb—0.5W—1.0Ta | 55 | 79 | 58 | 75 | 54 | 69 | 52 | 40 | 53 | 62 | 110 | 100 |
| Base + 0.04 Ce | 50 | 64 | 49 | 68 | 37 | 36 | 19 | 36 | | | | |

Notes:
Columns 1 give Ductilities by elongation (%)
Columns 2 give Ductilities by reduction in cross-sectional area (%)

TABLE 4

| ALLOY | | ULTIMATE TENSILE STRENGTH ($N.mm^{-2}$) | |
|---|---|---|---|
| IDENT. | COMPOSITION (weight %) | at 800° C. | % increase/decrease (+)   (−) |
| NPX-X | Base alloy (Ni—14.2 Cr—1.4 Si) | 175 | |
| NPX-1 | Base + 0.5 W | 217 | +24 |
| NPX-2 | Base + 3.0 Mo | 263 | +50 |
| NPX-3 | Base + 3.0 Nb | 311 | +78 |
| NPX-4 | Base + 1 0 Ta | 222 | +43 |
| NPX-5 | Base + 1.0 Mo + 0.5 W + 1.0 Nb + 1.0 Ta | 278 | +27 |
| SS 310* | Fe—25 Cr—20 Ni—2.0 Mn—1.5 Si | 205 | +17 (Base) −34 (NPX-3) |
| INC 600* | (Ni + Co) —16Cr—7½ Fe—1.0 Mn—½ Si—½ Cu | 135 | −23 (Base) −57 (NPX-3) |

*SS 310 = stainless steel 310
INC 600 = Inconel 600

The objects of this invention are achieved, in another aspect of the invention, by the use of novel special thermoelement conductor alloys.

The chemical compositional tolerances (percentages by weight) for the alloying components of the said special alloys are:

| Positive Alloy | Elemental Component | Negative Alloy |
|---|---|---|
| 14.2 ± 0.15 | Cr | 0.2 Maximum |
| 3.5 ± 0.1 | Nb | 3.5 ± 0.1 |
| 1.4 ± 0.05 | Si | 4.4 ± 0.2 |
| 3.5 ± 0.1 | Mo | 3.5 ± 0.1 |
| — | Mg | 0.15 ± 0.05 |
| 0.1 ± 0.03 | Fe | 0.1 ± 0.03 |
| 0.03 Maximum | C | 0.03 Maximum |
| balance | Ni | balance |

The said special alloys are designed to eliminate two deleterious effects which cause thermoelectric instability in nickel-base thermocouples in MIMS format.

One of these effects is that thermoelement conductor wires incorporated in conventional MIMS thermocouples are contaminated by dissolution of extraneous elements received from a different sheath alloy by thermal diffusion through the compacted insulating material. These elements, in particular manganese which diffuses in the vapour phase, can cause substantial changes in the thermal emf outputs of the thermocouples by virtue of their resultant changes in solid-solution composition.

Neither the new sheath alloys of this invention, nor type N thermoalloys, nor "special" grades of type K thermoalloys contain any manganese, so that contamination by manganese from these sources is not possible. However, the new sheath alloys of this invention contain, for example, 3.5 percent of niobium, and this element is a candidate for contamination of type N thermoelements by cross-diffusion. Whilst such contamination is unlikely by vapour phase transfer because of the very low vapour pressure of niobium, solid state transfer could occur. Such a possibility is eliminated, however, by the use of the new thermoelement alloys because they contain concentrations of niobium and molybdenum equal to that of the new sheath alloys. Since the chemical potential gradient for niobium and molybdenum between the preferred sheath alloy and the preferred thermoelement alloys of this invention is thus eliminated, this powerful driving force for cross diffusion in the MIMS thermocouple format is non-existent. Consequently, instability in thermoelectromotive force in the new MIMS thermocouple of this invention, due to this cause, is obviated.

It may be desired to retain thermal emf outputs equivalent to those of type N thermocouples in MIMS thermocouples fabricated from the preferred thermoalloys of this invention. This could be done, for example, by variation of the chromium content of each alloy within certain and well-defined critical limits. The chemical compositional tolerances (percentages by weight) for the alloying components of such modified alloys are:

| Positive Alloy | Elemental Component | Negative Alloy |
|---|---|---|
| 14.2 ± 4.0 | Cr | 1.0 Maximum |

-continued

| Positive<br>Alloy | Elemental<br>Component | Negative<br>Alloy |
|---|---|---|
| 3.5 ± 0.1 | Nb | 3.5 ± 0.1 |
| 1.4 ± 0.05 | Si | 4.4 ± 0.2 |
| 3.5 ± 0.1 | Mo | 3.5 ± 0.1 |
| — | Mg | 0.15 ± 0.05 |
| 0.1 ± 0.03 | Fe | 0.1 ± 0.03 |
| 0.03 Maximum | C | 0.03 Maximum |
| balance | Ni | balance |

The compositions of the thermocouple alloys in the present invention require the careful selection of component elements of very high purity and the achievement of correct proportions of each by adequate control of melting and casting techniques. In both the positive and negative thermocouple alloys the effects of one component element depend on those of the others and hence there is an interdependence of the elements within the overall composition. Thermocouple alloys of this invention may therefore be compositionally variant in respect of their Cr, Si, Mo, and Nb contents to a greater degree than is indicated by the preferred embodiments described above. The broad chemical compositional tolerances for the thermocouple alloys of this invention are therefore as follows (in percentages by weight).

| Positive<br>Alloy | Elemental<br>Component | Negative<br>Alloy |
|---|---|---|
| 10 to 25 | Cr | 2.0 Maximum |
| 10 Maximum | Nb | 10.0 Maximum |
| 0.5 to 5.0 | Si | 1.0 to 5.0 |
| 10.0 Maximum | Mo | 10.0 Maximum |
| 0.5 Maximum | Mg | 0.5 Maximum |
| 0.1 ± 0.03 | Fe | 0.1 ± 0.03 |
| 0.03 Maximum | C | 0.03 Maximum |
| balance | Ni | balance |

The invention also includes the above as novel alloys.

Another of the effects which cause thermoelectric instability in nickel-base thermocouples in MIMS format is a short-term drift in thermal emf of significant magnitude, occurring in the first 100-or-so hours of exposure of high-temperature.

A contributing cause advanced to explain this phenomenon is a change in major solute concentrations caused by initial sluggish reactions between such solutes and certain impurity elements residual in the alloys from manufacture. For example, the major solute chromium could react slowly with carbon to precipitate chromium carbide from solid solution in the alloy, with a concomitant change in thermoelectromotive force.

This problem could be overcome if the thermoalloys contained a minor addition of a further element which has a greater affinity for carbon that the major solutes. A rapid reaction between the additional minor more-reactive element and carbon during a preliminary heating would serve to 'lock-in' the latter element as a stable carbide prior to initial calibration of the thermocouple. Initial thermal emf changes due to this cause would therefore not be manifest in subsequent exposure of the thermocouple at high temperature. Such a reactive element is the niobium proposed for inclusion in each of the novel proposed thermoalloys of this invention.

As detailed above, there are several factors which cause compacted ceramic-insulated integrally-sheathed thermocouples to fail prematurely at high temperatures. This malaise exists because no consideration has hitherto been given to the optimum design of MIMS thermocouple as an integrated system. The choice of sheath material and the choice of thermocouple type has been made independently.

Figure 3:
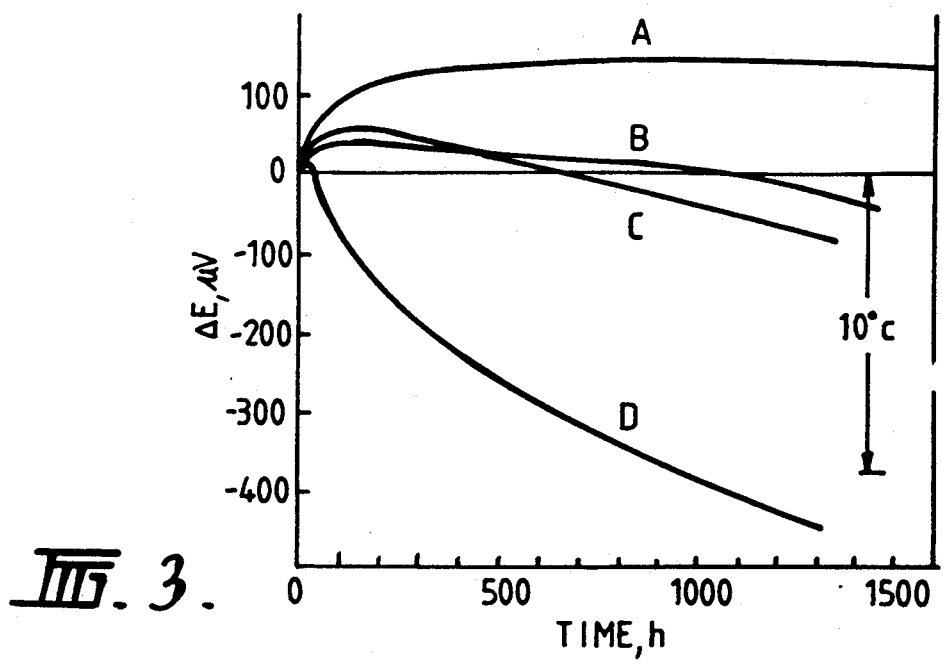
FIG. 3 illustrates the superior thermoelectrical stability of thermocouples according to the invention as will be referred to in more detail below.

The present invention combines several novel features which, although different in character, represent a complete whole in the form of the first MIMS thermocouple to be designed as an integrated system. This system comprises novel sheath elements and novel thermocouple conductors. That this integrated design of MIMS thermocouple produces a base-metal thermocouple which is thermoelectrically more stable than those of conventional design is illustrated in FIG. 3.

The elimination of premature failure and the ultra-high thermoelectric stability which characterize the present invention results from the use of sheath alloys and conductor thermoalloys which are of enhanced oxidation resistance up to 1300° C., and of enhanced thermomechanical properties. This eliminates the excessive oxidation of conventional sheath materials, the consequent excessive drift in thermoelectromotive force, and premature mechanical failures. Because sheaths and thermocouples are of identical or essentially similar composition, chemical contamination and fatigue failure of dissimilar conductor alloys is virtually eliminated. Nuclear transmutation effects are attenuated in the new MIMS construction by the absence of readily transmutable elements like cobalt and manganese from all compositions.

The invention will be further illustrated by the following non-limiting examples:

EXAMPLE 1

The integral compacted thermocouple cable of this Example is fabricated using existing manufacturing procedures. These begin with thermoelectrically matched thermoelement wires surrounded by non-compacted ceramic insulating material held within a metal tube. By drawing, swaging, or other mechanical reduction processes the tube is reduced in diameter and the insulation is compacted around the wires. The manufacturing process parameters are adjusted so that the ratios of sheath diameter to wires-size and sheath wall-thickness offer a balance between maximum wall-thickness and suitable insulation spacing for effective insulation resistance at elevated temperatures.

An important feature of the fabrication process is that considerable attention is given to the initial cleanliness and chemical purity of the components and retention of a high degree of cleanliness and dryness throughout fabrication. As already noted above, to make an actual sensor from this cable, the cable is cut and the ends of the conductors are exposed by removing some of the insulation therefrom. The exposed ends of the conductors are then joined to form a thermojunction, which may be accomplished for example by crimping and/or welding.

The thermojunction may simply be left exposed for use in appropriate environments, or may be protected by capping the sheath over the thermojunction with or without insulant. The measuring thermojunction of the thermocouple is usually, but not always, electrically isolated from the end of the sheath.

In this example, the alloys for the thermocouple conductor wires are those specified above as

| Positive Alloy (wt. %) | Elemental Component | Negative Alloy (wt. %) |
| --- | --- | --- |
| 14.2 | Cr | 0.2 Maximum |
| 3.5 | Nb | 3.5 |
| 1.4 | Si | 4.4 |
| 3.5 | Mo | 3.5 |
| — | Mg | 0.15 |
| 0.1 | Fe | 0.1 |
| 0.03 Maximum | C | 0.03 Maximum |
| balance | Ni | balance | and the alloy for the sheath is that specified above as

| Element | Concentration (wt. %) |
| --- | --- |
| Cr | 14.0 |
| Nb | 3.5 |
| Si | 1.4 |
| Mo | 3.5 |
| Mg | 0.15 |
| Ce | 0.05 |
| Ni | balance |

An important feature of the finished product of this example is that the essential similarity between the sheath alloy and the thermocouple conductor alloys virtually eliminates the destructive influences of thermocouple contamination by cross-diffusion, mechanical failure due to differential thermal stresses, and accelerated oxidation above about 1050° C. The strains caused by longitudinal stresses arising during thermal cycling are small because of the very small differences in the temperature coefficients of lineal expansion between the materials of the sheath and of the thermoelement conductors. Some typical average values of these coefficients of expansion are

| Component | $\times 10^{-6} \cdot °C.^{-1}$ (1000° C.) |
| --- | --- |
| sheath | 18 |
| thermoalloys | 17.5 (average of positive and negative) |

EXAMPLE 2

The integral compacted thermocouple cable and sensor of this example is the same as that described in Example 1, except that the alloys for the thermocouple conductor wires will be the thermocouple conductor wires of Example 1 but modified in composition to give outputs of a type N thermocouple as specified by the U.S. National Bureau of Standards. Such modified thermocouple conductor wires are those specified above as

| Positive Alloy (wt. %) | Elemental Component | Negative Alloy (wt. %) |
| --- | --- | --- |
| 11 to 17 | Cr | 1.0 Maximum |
| 3.5 Maximum | Nb | 3.5 Maximum |
| 1.4 | Si | 4.4 |
| 3.5 Maximum | Mo | 3.5 Maximum |
| — | Mg | 0.2 |
| 0.1 | Fe | 0.1 |
| 0.03 Maximum | C | 0.03 Maximum |
| balance | Ni | balance |

EXAMPLE 3

The integral compacted thermocouple cable and sensor of this example is the same as that described in Example 1, except that the alloys for the thermocouple conductor wires will be such as to give the thermoelectromotive force outputs of a type K thermocouple, as specified by the U.S. National Bureau of Standards, but modified in composition to eliminate the presence (and the consequent deleterious influences on stability of thermoelectromotive force) of manganese, as described above, in both alloys Such modified thermocouple conductor wires are of composition

| Positive Alloy (wt. %) | Elemental Component | Negative Alloy (wt. %) |
| --- | --- | --- |
| 9.3 | Cr | — |
| 0.4 | Si | 2.5 |
| 0.4 | Fe | 0.4 |
| Nil | Mn | Nil |
| balance | Ni | balance |

It will be clearly understood that we do not wish to be limited by any postulated or hypothetical mechanism for the observed beneficial effects of the present invention.

It will be clearly understood that the invention in its general aspects is not limited to the specific details referred to hereinabove.

What is claimed is:

1. Mineral insulated, metal-sheathed (MIMS) cable in which the sheath alloy has the following composition:

| Element | Concentration (wt %) |
| --- | --- |
| Cr | 14.0 ± 0.5 |
| Nb | 3.5 ± 1.5 |
| Si | 1.4 ± 0.1 |
| Mg | 0.15 ± 0.05 |
| Ce | 0.05 ± 0.05 |
| Ni | balance |

2. MIMS cable in which the sheath alloy has the following composition, expressed as weight-%: chromium 10 to 40, silicon 0.5 to 5.0, magnesium 0.5 maximum, cerium 0.5 maximum, molybdenum 1.0 to 20, tungsten 0.5 to 25, niobium 1.0 to 10.0, tantalum 0.5 to 8.0, and the balance nickel.

3. MIMS cable in which the sheath alloy has the following composition, expressed as weight-%: chromium 13.5 to 14.5, silicon 1.0 to 1.5, magnesium 0.2 maximum, cerium 0.2 maximum, molybdenum 1.0 to 5.0, tungsten 0.5 to 3.0, niobium 1.0 to 5.0, tantalum 1.0 to 4.0, and the balance nickel.

4. MIMS cable in which the sheath alloy has the following composition:

| Element | Concentration (wt. %) |
| --- | --- |
| Cr | 10 to 40 |
| Si | 0.5 to 5.0 |
| Mg | 0.5 Maximum |
| Ce | 0.3 Maximum |
| Mo | 20 Maximum |
| W | 25 Maximum |
| Nb | 10 Maximum |
| Ta | 8.0 Maximum |
| Ni | balance |

5. MIMS cable in which the sheath alloy has the following composition:

| Element | Concentration (wt. %) |
|---|---|
| Cr | 13.5 to 14.5 |
| Si | 1.0 to 1.8 |
| Mg | 0.5 Maximum |
| Ce | 0.5 Maximum |
| Mo | 5.0 Maximum |
| W | 3.0 Maximum |
| Nb | 5.0 Maximum |
| Ta | 4.0 Maximum |
| Ni | balance |

6. Thermocouple comprising MIMS cable having a sheath alloy of composition defined in any one of claims 1 to 5, in which the thermoelement conductor alloys having the following composition, expressed as weight-%:

| Positive Alloy | Elemental Component | Negative Alloy |
|---|---|---|
| 10 to 25 | Cr | 2.0 Maximum |
| 10.0 Maximum | Nb | 10.0 Maximum |
| 0.5 to 5.0 | Si | 1.0 to 5.0 |
| 10.0 Maximum | Mo | 10.0 Maximum |
| 0.5 Maximum | Mg | 0.5 Maximum |
| 0.1 ± 0.03 | Fe | 0.1 ± 0.03 |
| 0.03 Maximum | C | 0.03 Maximum |
| balance | Ni | balance |

7. Thermocouple comprising MIMS cable having a sheath alloy of composition defined in any one of claims 2 to 5, in which the thermoelement conductor alloys having the following composition, expressed as weight-%:

| Positive Alloy | Elemental Component | Negative Alloy |
|---|---|---|
| 14.2 ± 4.0 | Cr | 1.0 Maximum |
| 3.5 ± 0.1 | Nb | 3.5 ± 0.1 |
| 1.4 ± 0.05 | Si | 4.4 ± 0.2 |
| 3.5 ± 0.1 | Mo | 3.5 ± 0.1 |
| — | Mg | 0.15 ± 0.05 |
| 0.1 ± 0.03 | Fe | 0.1 ± 0.03 |
| 0.03 Maximum | C | 0.03 Maximum |
| balance | Ni | balance |

8. Thermocouple comprising MIMS cable having a sheath alloy composition defined in any one of claims 1 to 5, in which the thermoelement conductor alloys have the following composition, expressed as weight-%:

| Positive Alloy | Elemental Component | Negative Alloy |
|---|---|---|
| 14.2 ± 0.15 | Cr | 0.2 Maximum |
| 3.5 ± 0.1 | Nb | 3.5 ± 0.1 |
| 1.4 ± 0.05 | Si | 4.4 ± 0.2 |
| 3.5 ± 0.1 | Mo | 3.5 ± 0.1 |
| — | Mg | 0.15 ± 0.05 |
| 0.1 ± 0.03 | Fe | 0.1 ± 0.03 |
| 0.03 Maximum | C | 0.03 Maximum |
| balance | Ni | balance |

9. MIMS cable according to any one of claims 1 to 5 in which the cable is back filled with an inert gas after removal of residual air.

10. A heating element or heat detector comprising MIMS cable according to any one of claims 1 to 5.

* * * * *

UNITED STATES PATENT AND TRADEMARK OFFICE
CERTIFICATE OF CORRECTION

PATENT NO. : 5,010,316

DATED : April 23, 1991

INVENTOR(S) : Noel A. Burley

It is certified that error appears in the above-identified patent and that said Letters Patent is hereby corrected as shown below:

On the cover page, Item [73], the Assignee's name should be -- Nicrobell Pty Limited --.

On the cover page, Item [56], under Other Publications, line 7, "Mineral-In-sulated" should read -- Mineral-Insulated --.

On the cover page, Item [57], line 2, "(MINS)" should read -- (MIMS) --.

Column 6, line 21, delete "tang-", and insert therefor -- tungsten --.

Column 6, line 22, delete "sten".

Column 12, line 32, delete "Mineral insulated,", and insert therefor -- Mineral-insulated, --.

Column 13, line 19, delete "having", and insert therefor -- have --.

Signed and Sealed this

Fifteenth Day of December, 1992

*Attest:*

DOUGLAS B. COMER

*Attesting Officer*  Acting Commissioner of Patents and Trademarks